US010388899B2

(12) United States Patent
Carbonera et al.

(10) Patent No.: US 10,388,899 B2
(45) Date of Patent: Aug. 20, 2019

(54) INVERTED POLYMER SOLAR CELLS AND PROCESS FOR PRODUCING THE SAME

(71) Applicant: ENI S.p.A., Rome (IT)

(72) Inventors: Chiara Carbonera, Trecate (IT); Anna Calabrese, Messina (IT); Marja Vilkman, Helsinki (FI)

(73) Assignee: ENI S.p.A., Rome (IT)

( * ) Notice: Subject to any disclaimer, the term of this patent is extended or adjusted under 35 U.S.C. 154(b) by 267 days.

(21) Appl. No.: 15/034,225

(22) PCT Filed: Nov. 4, 2014

(86) PCT No.: PCT/IB2014/065787

§ 371 (c)(1),
(2) Date: May 4, 2016

(87) PCT Pub. No.: WO2015/068102

PCT Pub. Date: May 14, 2015

(65) Prior Publication Data

US 2016/0285024 A1 Sep. 29, 2016

(30) Foreign Application Priority Data

Nov. 5, 2013 (IT) .............................. MI2013A1831

(51) Int. Cl.
*H01L 51/44* (2006.01)
*H01L 51/00* (2006.01)
(Continued)

(52) U.S. Cl.
CPC ........ *H01L 51/448* (2013.01); *H01L 51/0021* (2013.01); *H01L 51/0036* (2013.01);
(Continued)

(58) Field of Classification Search
CPC ............... H01L 51/448; H01L 51/0021; H01L 51/0036; H01L 51/0037; H01L 51/0046; H01L 51/0047; H01L 51/4273; H01L 51/441; H01L 31/02; H01L 31/0216; H01L 31/0224; H01L 31/0248; H01L 31/0256; H01L 33/02; H01L 33/26; H01L 33/36; H01L 33/40; H01L 33/44
See application file for complete search history.

(56) References Cited

U.S. PATENT DOCUMENTS

| | | | | |
|---|---|---|---|---|
| 2003/0111106 | A1* | 6/2003 | Nagano | H01L 31/02363 136/255 |
| 2009/0188558 | A1 | 7/2009 | Jen et al. | |
| 2010/0012178 | A1* | 1/2010 | Yang | B82Y 10/00 136/256 |

FOREIGN PATENT DOCUMENTS

| | | | |
|---|---|---|---|
| CN | 102386336 | A | 3/2012 |
| CN | 103236500 | A | 8/2013 |

OTHER PUBLICATIONS

Combined Office Action and Search Report dated Oct. 31, 2017 in Chinese Patent Application No. 201480065226.8 (with English translation).

(Continued)

*Primary Examiner* — Susan D Leong
(74) *Attorney, Agent, or Firm* — Oblon, McClelland, Maier & Neustadt, L.L.P.

(57) ABSTRACT

Inverted polymer solar cell comprising: an electron contact layer; a cathodic buffer layer; an active layer comprising at least one π-conjugated polymer and at least one organic electron acceptor compound; an anodic buffer layer; a hole contact layer; wherein the cathodic buffer layer comprises zinc oxide and/or titanium dioxide and at least one interfacial agent selected from optionally substituted $C_7$-$C_{21}$ aromatic carboxylic acids or salts thereof. Such polymer solar cells have improved performance in terms of high charge mobility, high transparency, high efficiency and high chemical stability, which can be produced on a large industrial scale with a high surface area. A process for producing the same is also provided.

21 Claims, 7 Drawing Sheets

(51) Int. Cl.
*H01L 31/18* (2006.01)
*H01L 31/0224* (2006.01)
*H01L 51/42* (2006.01)

(52) U.S. Cl.
CPC ...... *H01L 51/0037* (2013.01); *H01L 51/0047* (2013.01); *H01L 51/4273* (2013.01); *H01L 51/441* (2013.01); *H01L 2251/303* (2013.01); *H01L 2251/308* (2013.01); *Y02E 10/549* (2013.01)

(56) References Cited

OTHER PUBLICATIONS

Hin-Lap Yip, et al., "Polymer Solar Cells that Use Self-Assembled-Monolayer-Modified ZnO/Metals as Cathodes", Advanced Materials, 2008, 7 pages.
Steven K. Hau, et al., "Interfacial modification to improve inverted polymer solar cells", Journal of Materials Chemistry, 2008, 18, pp. 5113-5119.
International Search Report dated Dec. 10, 2014 in PCT/IB2014/065787.
Jessica Krüger et al., "Modification of $TiO_2$Heterojunctions with Benzoic Acid Derivatives in Hybrid Molecular Solid-State Devices", Advanced Materials, vol. 12, No. 6, XP000923878, Mar. 16, 2000, pp. 447-451.
Jia Hu et al., "Effects of ZnO Fabricating Process on the Performance of Inverted Organic Solar Cells", Organic Electronics, vol. 13, No. 7, XP028485648, Mar. 17, 2012, pp. 1171-1177.

* cited by examiner

INVERTED POLYMER SOLAR CELLS AND PROCESS FOR PRODUCING THE SAME

The present invention relates to an inverted polymer solar cell and to a process for producing the same.

Photovoltaic devices are devices capable of converting the energy of a light radiation into electric energy. At present, most photovoltaic devices which can be used for practical applications exploit the physico-chemical properties of photo-active materials of the inorganic type, in particular high-purity crystalline silicon. As a result of the high production costs of silicon, scientific research has been orienting its efforts towards the development of alternative organic materials having a polymeric structure (so-called "polymer photovoltaic cells"). Unlike high-purity crystalline silicon, in fact, organic polymers are characterized by a relative synthesis facility, a low production cost, a reduced weight of the relative photovoltaic device, in addition to allowing the recycling of said polymer at the end of the life-cycle of the device in which it is used. The aforementioned advantages make organic photoactive materials very attracting, in spite of the lower efficiencies of organic-based devices as compared to inorganic photovoltaic cells.

The functioning of polymer photovoltaic cells is based on the combined use of an electron acceptor compound and an electron donor compound. In the state of the art, the most widely-used electron donor and acceptor compounds in photovoltaic devices are, respectively, π-conjugated polymers and derivatives of fullerenes, in particular PC61BM ([6,6]-phenyl C61 butyric acid methyl ester) and PC71BM (([6,6]-phenyl C71 butyric acid methyl ester).

The basic conversion process of light into electric current in a polymer photovoltaic cell takes place through the following steps:

1. absorption of a photon from the donor compound with the formation of an exciton, i.e. an "electron-hole" pair;
2. diffusion of the exciton in a region of the donor compound in which its dissociation can take place;
3. dissociation of the exciton in the two separated charge carriers (electron (−) and hole (+));
4. transporting of the carriers thus formed to the electron contact (electron, through the acceptor compound) and hole contact (hole, through the donor compound), with the generation of an electric current in the circuit of the device.

The photo-absorption process with the formation of the exciton and subsequent transfer of the electron to the acceptor compound consist in the excitation of an electron from the HOMO (Highest Occupied Molecular Orbital) to the LUMO (Lowest Unoccupied Molecular Orbital) of the donor and subsequently the transfer from this to the LUMO of the acceptor.

As the efficiency of a polymer photovoltaic cell depends on the number of free electrons which are generated by dissociation of the excitons, one of the structural characteristics of the donor compounds which mostly influences said efficiency is the difference in energy existing between the HOMO and LUMO orbitals of the donor (so-called band-gap). The wavelength of the photons which the donor compound is capable of collecting and effectively converting into electric energy (so-called "photon harvesting" or "light-harvesting" process) depends, in particular, on this difference. In order to obtain acceptable electric currents, the band-gap between HOMO and LUMO must not be too high, but at the same time, it must not be too low, as an excessively low gap would decrease the voltage obtainable at the electrodes of the device. The electron donor material most commonly used in the production of polymer solar cells is regio regular poly(3-hexylthiophene) (P3HT). Regioregularity improves the micro-structure ordering and crystallinity and thus favours electrical conductivity. This polymer has optimal electronic and optical characteristics (good HOMO and LUMO orbital values, suitable absorption coefficient), a good solubility in the solvents used for producing the cells and a reasonable hole mobility. Other examples of polymers that can be profitably used as electron donor materials are described, for instance, in C. L. Chocos and S. S. Choulis, Prog. Polym. Sci., 36, 1326-1414 (2011); L. Bian, E. Zhu, J. Tang, W. Tang and F. Zhang, Prog. Polym. Sci., 2012, doi: 10.1016/j.progpolymsci.2012.03.001; J. Chen and Y. Cao, Acc. Chem. Res. 42, 1709-1718 (2009); P. T. Boudreault, A. Najari and M. Leclerc, Chem. Mater. 23, 456-469 (2011).

Another important characteristic in the production of organic solar cells is the mobility of the electrons in the acceptor and electron holes in the donor materials, which determines the facility with which the electric charges, once photogenerated, reach the electrodes. Besides being an intrinsic property of the molecules, mobility is also strongly influenced by the morphology of the photoactive layer, that in turn depends on the reciprocal miscibility of the components and their solubility.

Moreover, the interface between the electrodes and the photoactive layer should have features that facilitate the charge carrier transfer towards the electrodes.

Finally, a further fundamental characteristic is the resistance to thermooxidative and photo-oxidative degradation of the materials, which must be stable under the operating conditions of the device. In the simplest way of operating, cells with conventional architecture (namely the one known as "bulk heterojunction" architecture) are produced by introducing a thin layer (about 100 nanometers) of a mixture of the electron acceptor and electron donor materials, between two electrodes, usually constituted by Indium Tin Oxide (ITO, anode) and Aluminium (Al, cathode). To obtain a layer of this type, a solution of the two components is prepared.

Generally, to obtain such a thin layer, a solution of the two compounds is prepared and starting from this, a photoactive film is then created on the first electrode, the hole contact [Indium Tin Oxide (ITO)], using suitable deposition techniques such as "spin-coating", "spray-coating", "gravure printing", "ink-jet printing", "slot-die coating", etc. Finally, the counter-electrode is deposited on the dried film [i.e. cathode, in Aluminium (Al)]. Optionally, between the electrodes and the photoactive film, other additional layers can be inserted which can perform specific functions pertaining to electric, optical or mechanical properties.

In order to favour electronic holes and, at the same time, to block or limit the electrons access to the anode (ITO), in general a further layer is deposited before the formation of the photoactive layer from the donor-acceptor solution as described above, in order to improve charge collection at the electrode and to inhibit recombination phenomena. Said film is deposited starting from a water suspension of PEDOT:PSS [poly ethylenedioxythiophene) poly(styrenesulfonate)], using suitable coating and printing techniques such as "spin-coating", "spray-coating", "gravure printing", "ink-jet printing", "slot-die coating", etc.

In case of inverse architecture, the transparent electrode made of ITO constitutes the electron contact, while the metallic electrode (generally silver or gold) works as the hole contact. Between the active layer and the electrons, also in this case suitable interface materials are employed. Reversing the typical geometry of organic photovoltaic cells results in more environmentally robust devices.

The interface between the active layer and the electrodes must have properties that facilitate the charge collection. To improve the performance of organic and polymer solar cells, "buffer layers" or "interlayers" or "interfacial layers" are used. These are thin layers (generally 0.5-100 nm) of inorganic, organic or polymeric materials that are interposed between the hole contact and the active layer and/or the electron contact and the active layer with the following aims:

- to tune the work function of the electrode and making more ohmic the contact between the electrode(s) and the active layer, and/or
- to favour the transport of the charge carriers (electrons to the electron contact and holes to the hole contact), and/or
- to disfavour the drifting of carriers having the opposite charge, and/or
- to limit or avoid the exciton recombination at the organic phase/electrode(s) interface, and/or
- to smooth the surface of the electrode(s) avoiding the formation of pinholes, and/or
- to protect the active layer from chemical reactions and damaging when deposition processes for electrode(s) fabrication (i.e. evaporation, sputtering, e-beam deposition, etc.) are performed, and/or
- to limit or avoid the diffusion of metal impurities from the electrode(s) to the active layer, and/or
- to act as optical spacers.

In particular, cathodic interfacial layers must (i) produce an ohmic contact between the active layer and the cathode, (ii) favour the transport of electrons toward the cathode, (iii) block the transport of holes toward the cathode.

Interfacial layers can fabricated according to the art by spin-coating, spray-coating, printing techniques, sputtering, vacuum-evaporation, sol-gel deposition. Materials and methods are reviewed in R. Po, C. Carbonera, A. Bernardi, N. Camaioni, Energy Environ. Sci., 4, 285 (2011).

Hwang et al. in Journal of Materials Research, 25, 695 (2010) describe the preparation of a ZnO sol-gel precursor from zinc acetate dihydrate in 2-methoxyethanol and 2-amminoethanol as stabilizer. No reference is made to the properties (viscosity, boiling point) of the solvent. The material is used for thin-film transistor fabrication. The ZnO film is deposited on $SiO_2$/Si and treated at 200° C., a temperature unsuitable for devices on polymeric flexible supports, such as PET (polyethylene therephthalate) having a glass transition temperature of about 80° C.

Luo et al. in Transactions of Nonferrous Metal Society of China, 17, s814 (2007) describe the preparation of a ZnO sol-gel precursor from zinc acetate dihydrate in isopropanol and 2-amminoethanol solutions. The ZnO film on quarz substrate is obtained by drying at 200° C., and thermal treatment in a furnace (400-600° C.); again, the temperatures are unsuitable for devices on polymeric flexible supports.

Huang et al. in Nanotechnology, 2008. NANO '08. 8th IEEE Conference Proceedings, describe the preparation of a ZnO sol-gel precursor from zinc acetate dihydrate in 2-methoxyethanol and 2-amminoethanol solutions. The ZnO-nanorod films are prepared by deposition on silicon wafers and treatment at 900° C., a temperature unsuitable for plastic polymer solar cells.

Naik et al. in Journal of the Electrochemical Society, 158, H85 (2011) describe the preparation of a ZnO sol-gel precursor from zinc acetate dihydrate in a mixture of glycerol and ethylene glycol. The thermal treatment of the film takes place at 550° C. Park et al. in Journal of Nanoelectronics and Optoelectronics, 5, 1 (2010) describe the preparation of a ZnO sol-gel precursor from zinc acetate dihydrate in 2-methoxyethanol and 2-amminoethanol as stabilizer and its use in the fabrication of flexible inverted solar cells. The PCE of the devices are approximately in the range 1.2-2.2%. No information about the device stability is provided.

Yip et al. in Applied Physics Letters, 193313, 92 (2008) describe the fabrication of inverted solar cells with a zinc oxide cathode buffer layer and a self-assembled monolayer (SAM) of aliphatic acids deposited on top. The deposition of the two layers (ZnO and SAM) takes place in two separate steps.

Yip et al. in Advanced Materials, 2376, 20 (2008) describe solar cells with a ZnO layer and a SAM of polar aromatic acids and stress the fact that the control of the order in the SAM and the direction of the generated dipole is crucial to obtain improved power conversion efficiencies. This precise control at a molecular level was not demonstrated on large area devices (>1 $cm^2$), making this two-step process very difficult to be realized and possibly unsuitable for industrial applications.

Many published reports (Manor et al., Sol. Energy Mater. Sol. Cells, doi: 0.1016/j.solmat.2011.11; Sista et al., Adv. Mater., 22, 380 (2010); Tromholt et al., Nanotechnology, 22, 225401 (2011); Liliedal et al., Sol. Energy Mater. Sol. Cells, 94, 2018 (2010); Jouanne et al., J. Mater. Chem., 22, 1606 (2012)) show how polymer solar cells with ZnO cathode buffer layer exhibit a characteristic S-Shaped current-voltage curve. This behavior is attributed to the low zinc oxide conductance and poor charge extraction and implies lower Jsc, lower Voc and even lower FF. Physical post-treatments on the device (e.g. UV irradiation) are suggested to overcome this problem and thus attaining acceptable power conversion efficiencies, but they introduce undesirable and expensive additional steps in the fabrication processes. Therefore, a simple method to fabricate efficient devices with ZnO interlayers is highly desirable.

Kuwabara et al. in Organic Electronics 13 (2012), 1136-1140, disclose flexible and air-stable inverted polymer solar cells on PET substrates comprising, as cell structure, indium tin oxide on PET/ZnO/PCBM:P3HT/PED-OT:PSS/Au. Reproducible cell performances were obtained despite the ZnO cells being fabricated in air and at low temperatures, using a novel ZnO precursor solution containing zinc(II) acetylacetonate as a metal source and acetylacetone as a $Zn^{2+}$ complexing agent.

The Applicants have faced the problem of providing inverted polymer solar cells having improved performance in terms of high charge mobility, high transparency, high efficiency and high chemical stability, which can be produced on a large industrial scale with a high surface area.

The Applicants have found that the above and other aims can be achieved by an inverted polymer solar cell as defined hereinbelow, having a cathodic buffer layer comprising zinc oxide and/or titanium dioxide and at least one interfacial agent selected from optionally substituted $C_7$-$C_{21}$ aromatic carboxylic acids or salts thereof, which is formed onto the electron contact layer by applying a composition comprising at least one zinc oxide and/or titanium dioxide precursor and said at least one interfacial agent and by subsequent annealing of the same. This process can be applied on a large scale also for devices having high surface area.

Therefore, according to a first aspect, the present invention relates to an inverted polymer solar cell comprising: an electron contact layer;

a cathodic buffer layer;

an active layer comprising at least one π-conjugated polymer and at least one organic electron acceptor compound;

an anodic buffer layer;

a hole contact layer;

wherein the cathodic buffer layer comprises zinc oxide and/or titanium dioxide and at least one interfacial agent selected from optionally substituted $C_7$-$C_{21}$ aromatic carboxylic acids or salts thereof.

According to another aspect, the present invention relates to a process for producing an inverted polymer solar cell which comprises:

providing an electron contact layer;

depositing a cathodic buffer layer onto said electron contact layer;

depositing an active layer onto said cathodic buffer layer comprising at least one π-conjugated polymer and at least one organic electron acceptor compound;

depositing an anodic buffer layer onto said active layer;

providing a hole contact layer onto said anodic buffer layer;

wherein the step of depositing a cathodic buffer layer comprises: forming a layer onto said electron contact layer of a composition comprising: at least zinc oxide and/or titanium dioxide or a precursor thereof, at least one organic solvent, at least one chelating agent, and at least one interfacial agent selected from optionally substituted $C_7$-$C_{21}$ aromatic carboxylic acids or salts thereof;

annealing said layer formed onto said electron contact layer so as to form the cathodic buffer layer comprising zinc oxide and/or titanium dioxide.

As to the electron contact layer, it is preferably formed from a material selected from: Indium Tin Oxide (ITO), Fluorine doped Tin Oxide (FTO), Aluminium doped Zinc Oxide (AZO), Gadolinium Oxide doped Zinc Oxide (GZO).

The electron contact layer is preferably associated to a substrate layer, which may be formed from a rigid material (such as glass) or a flexible material, such as a thermoplastic polymeric material, e.g. polyethyleneterephthalate (PET), polyethylene naphthalate (PEN), polyethyleneimine (PEI). As to the active layer, the π-conjugated polymer may be selected from:

(a) polythiophene polymers such as poly(3-hexylthiophene) (P3HT), poly(3-octylthiophene), poly(3,4-ethylendioxythiophene) or mixture thereof; preferably the π-conjugated polymer is regioregular poly(3-hexylthiophene) (P3HT);

(b) poly(phenylene-vinylene)polymers such as poly(2-metoxy-5-(2-ethyl-exyloxy)-1,4-phenylenevinylene, poly (p-phenylene-vinylene) {(poly[2-methoxy-5-(3,7-dimethyloxy)-1,4-phenylen]-alt-(vinylene)} (MDMO-PPV) or mixtures thereof;

(c) alternating conjugated copolymers comprising:

naphthalene diimide units A having general formula (I)

(I)

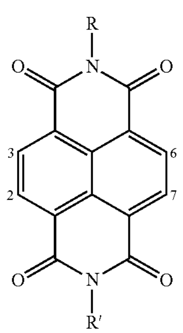

wherein R and R', the same or different, are selected from alkyl groups, preferably branched, containing from 1 to 36 carbon atoms, preferably from 4 to 24, more preferably from 6 to 18 carbon atoms, or aryl groups, preferably phenyls, said aryl groups being optionally substituted with alkyl radicals having from 1 to 24 carbon atoms, preferably from 4 to 18 carbon atoms;

at least one conjugated electron-donor structural unit B, wherein unit A is connected to unit B, in the alternating copolymer, in any of the positions 2, 3, 6 or 7;

(d) alternating or statistical conjugated copolymers comprising:

at least one benzotriazole unit B having general formula (Ia) or (Ib):

(Ia)

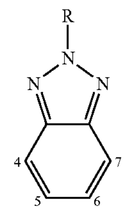

(Ib)

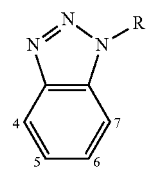

wherein the group R is selected from alkyl, aryl, acyl or thioacyl groups, possibly substituted;

at least one conjugated structural unit A, wherein each unit B is connected to at least one unit A in any of the positions 4, 5, 6 or 7, preferably in positions 4, 7;

(e) alternating π-conjugated polymers comprising:

at least one fluoroarylvinylidene electron-acceptor unit A having general formula (III)

(III)

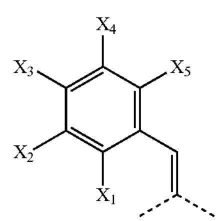

wherein the substituents X1-X5, the same or different, are selected from hydrogen atoms, fluorine atoms or alkyl groups containing from 1 to 12 carbon atoms, preferably from 1 to 4 carbon atoms, and with the proviso that at least one, preferably at least two, more preferably at least three, of the substituents X1-X5 is a fluorine atom or a —CF2R group, wherein R is selected from H, F or a hydrocarbyl group, possibly fluorinated, having from 1 to 10 carbon atoms, at least one conjugated electron-donor structural unit B connected to the unit A in the points indicated by the dashed lines in general formula (III);

(f) copolymers based on acridonic units comprising:
a monomeric unit (A) having general formula (IV)

(IV)

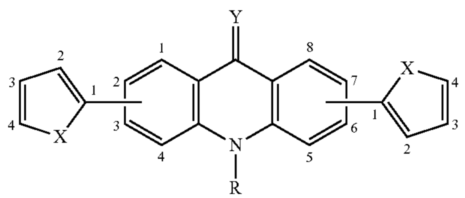

wherein:
X is selected from S or Se,
Y is selected from O, S or NR',
R, R', the same or different, are organic substituents having from 1 to 24 carbon atoms selected from alkyl groups optionally substituted, aryl groups, acyl or thioacyl groups;
at least one monomer unit (B) having general formula (V)

(V)

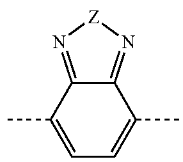

wherein Z is O, S, Se or —NR'', wherein R'' is an organic substituent having from 1 to 24 carbon atoms selected from alkyl groups optionally substituted, aryl groups optionally substituted, acyl or thioacyl groups, said monomeric unit (B) being connected to any position available of a hetero-aromatic side ring of the unit (A) through one of the two positions indicated by the dashed lines in general formula (V);

(g) alternating π-conjugated copolymers comprising benzothiadiazole units such as PCDTBT {poli[N-9''-eptadecanyl-2,7-carbazole-alt-5,5-(4',7'-di-2-thienyl-2',1',3'-benzothiadiazole)]}, PCPDTBT {poli[2,6-(4,4-bis-(2-ethylexyl)-4H-cyclopent[2,1-b;3,4-b']-dithiophene)-alt-4,7-(2,1,3-benzothiadiazole)]};

(h) alternating π-conjugated copolymers comprising thieno[3,4-b]pyrazidine units;

(i) alternating π-conjugated copolymers comprising quinoxaline units;

(l) alternating π-conjugated copolymers comprising silyl monomeric units such as 9,9-dialkyl-9-silafluorene;

(m) alternating π-conjugated copolymers comprising condensed thiophene units such as copolymers of thieno[3,4-b]thiophene and benzo[1,2-b:4,5-b']ditiophene;

or mixture thereof.

Examples of the above-mentioned alternating π-conjugated copolymers (c) and details about their methods of preparation can be found for example in WO 2010/006698.

Examples of the above-mentioned alternating or statistical π-conjugated copolymers (d) and details about their methods of preparation can be found for example in WO 2010/046114.

Examples of the above-mentioned alternating π-conjugated copolymers (e) and details about their methods of preparation can be found for example in WO 2011/066954.

Examples of the above-mentioned alternating π-conjugated copolymers (f) and details about their methods of preparation can be found for example in WO 2011/066954.

Examples of the above-mentioned alternating π-conjugated copolymers (g)-(m) and details about their methods of preparation can be found for example in "Accounts of Chemical Research" (2009), Vol. 42, No. 11, pag. 1709-1718, "Development of Novel Conjugated Donor Polymers for High-Efficiency Bulk-Heterojunction Photovoltaic Device" (Chen et al.).

As to the active layer, the π-conjugated polymer may be selected also from the polymers of the following general formulas:

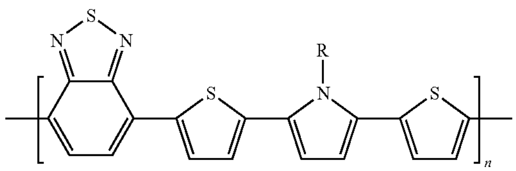

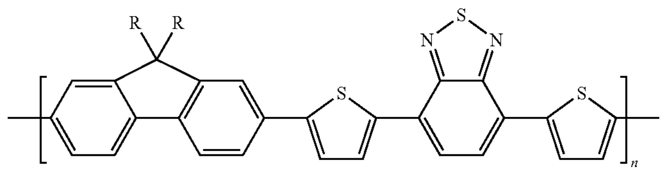

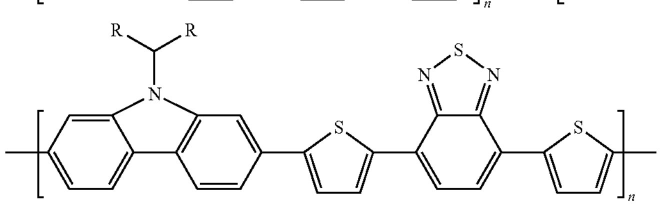

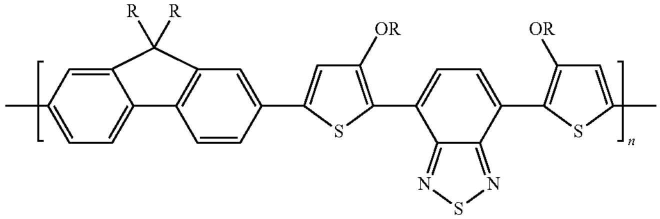

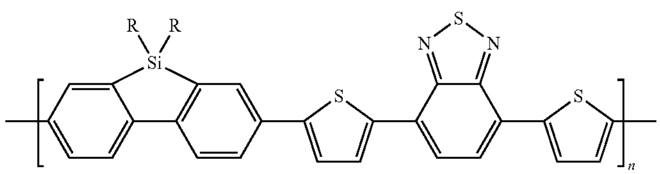

-continued

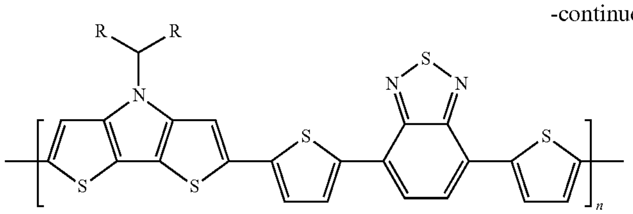

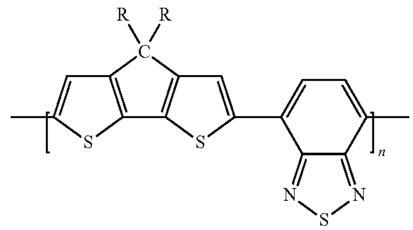

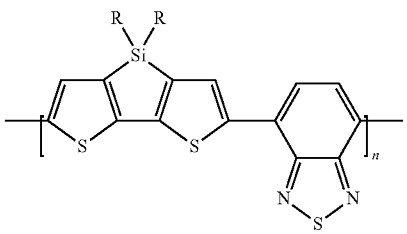

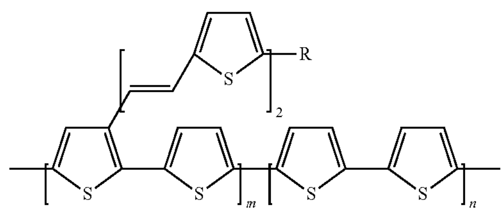

m/n = 0, 59

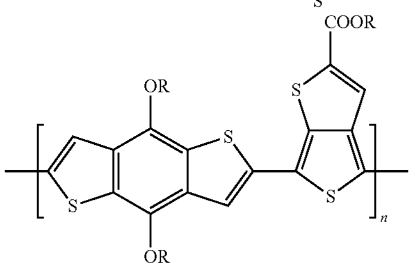

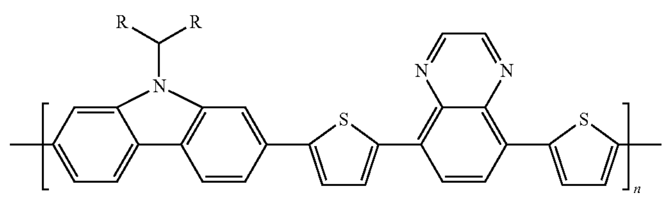

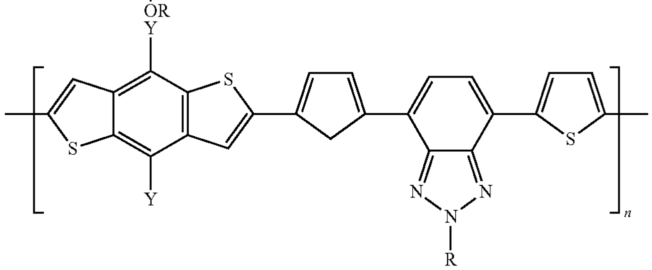

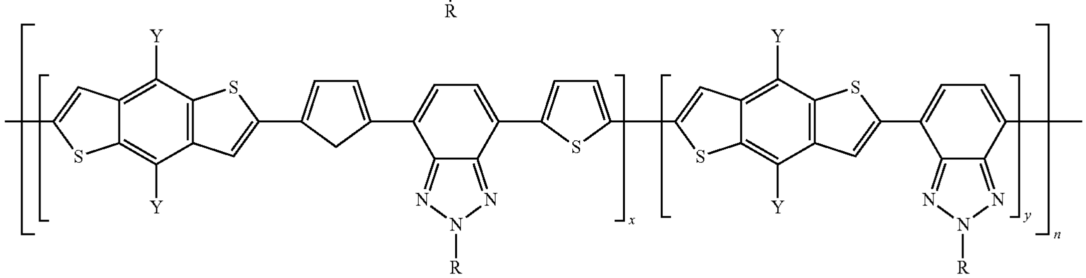

wherein:

R, the same or different, are selected from alkyl groups having from 1 to 20 carbon atoms, preferably from 6 to 15;

Y, the same or different, are selected from —R or —OR groups wherein R has the same meaning indicated above;

n and m, the same or different, are integer numbers comprised between 2 and 500, preferably between 5 and 100, included extremes, x+y=1, wherein x>0,1 and y>0,1, or mixtures thereof.

The organic electron acceptor compound, which is combined with the π-conjugated polymer, may be selected, for instance, from fullerene derivatives, such as: [6,6]-phenyl-C61-butyric acid methyl ester (PCBM), (6,6)-phenyl-C70-butyric acid methyl ester (PC70BM), indene-C60 bis-adduct (ICBA), bis(1-[3-(methoxycarbonyl)propyl]-1-phenyl)-[6.6]C62 (Bis-PCBM).

As to the anodic buffer layer, it may be selected for instance from: poly(3,4-ethylenedioxy)thiophene (PEDOT) doped with p-styrenesulphonic acid (PSS), $MoO_3$, polyaniline, $NiO_2$, $WO_3$, $V_2O_5$.

As to the a hole contact layer, it is generally made from a metal, such as gold (Au), silver (Ag).

As regards the zinc oxide precursor, it may be selected from zinc salts and zinc complexes, such as: zinc acetate, zinc formiate, zinc acetylacetonate, zinc alcoholates (methoxide, ethoxide, propoxide, isopropoxide, butoxide, etc.), zinc carbammate, zinc bis(alkylamide)s, zinc dialkyls or diaryls (diethylzinc, diphenylzinc, etc.), or mixtures thereof.

As regards the titanium dioxide precursor, it may be selected from titanium salts and titanium complexes, such as: titanium acetylacetonate, titanium alcoholates (methoxide, ethoxide, propoxide, isopropoxide, butoxide, etc.), titanium carbammate, titanium bis(alkylamide)s, titanium dialkyls or diaryls (diethylzinc, diphenylzinc, etc.), or mixtures thereof.

The amount of the zinc oxide and/or titanium dioxide precursor is such that the final concentration in the composition is from 0.05 to 0.5 M, preferably from 0.1 to 0.25 M.

As regards the chelating ligand, it may be selected from: ethanolamine, diethanolamine, ethylendiamine, or mixtures thereof.

The amount of the chelating ligand is such that the molar ratio ligand/Zn is from 0.5 to 4, preferably from 1 to 2.5. Zinc oxide and/or titanium dioxide can be also used instead of a precursor thereof. Preferably, these oxide are in the form of nanoparticles having a diameter within the range 10-200 nm, more preferably lower than 40 nm.

As to the organic solvent, it is preferably selected from $C_1$-$C_{10}$ alcohols. According to a preferred embodiment, the solvent is a mixture of two $C_2$-$C_6$ alcohols. Preferably, one of the two alcohols has a boiling point lower than 100° C. and a viscosity higher than 3 mPa·s, while the second alcohol has a boiling point equal to or higher than 100° C. and a viscosity equal to or lower than 3 mPa·s. Preferably the weight ratio [low boiling point-high viscosity alcohol]/[high boiling point-low viscosity alcohol] is between 0.01 and 5, more preferably between 0.1 and 0.5.

As regards the interfacial agent, it is preferably selected from benzoic acid and substituted benzoic acids, even more preferably from benzoic acids p-substituted with an electron withdrawing or an electron donating group, preferably selected from:

—$R_1$, wherein $R_1$ is a $C_1$-$C_{12}$ alkyl, e.g. methyl, ethyl, propyl, n-butyl, i-butyl, t-butyl, hexyl, octyl, decyl, and the like;

—$OR_2$, wherein $R_2$ is a $C_1$-$C_{12}$ alkyl, e.g. methyl, ethyl, propyl, n-butyl, i-butyl, t-butyl, hexyl, octyl, decyl, and the like;

—CN;

—$CF_3$.

When in the form of a salt, the interfacial agent may be a salt of a metal selected from: alkali metals (e.g. Li, Na, K), alkaline-earth metals (e.g. Mg, Ca, Sr), transition metals (e.g. Ti, Mo, Mn, Fe, Ru, Co, Rh, Ni, Cu, Ag, Au, Zn). In this respect, it should be noted that, during the annealing step, it is likely that at least a portion of the initially added interfacial agent is transformed into a Zn and/or Ti salt, depending on the precursor present in the composition.

Preferably, the amount of the interfacial agent is such that the molar ratio interfacial agent/[Zn and/or Ti] is from 0.01 to 0.2, more preferably from 0.05 to 0.1.

The composition to be deposited onto the electron contact layer is preferably in the form of a solution, a suspension or a dispersion.

The annealing step of the layer formed onto said electron contact layer so as to form the cathodic buffer layer is preferably carried out by heating the layer at a temperature of from 50 to 200° C., more preferably from 100 to 140, for a time usually ranging from 30 seconds to 2 hours, more preferably from 1 minute to 1 hour.

The layers forming the solar cell can be deposited, for example, by means of spin coating, drop casting, doctor blade casting, vacuum evaporation techniques, printing techniques (such as gravure printing, slot-die coating, ink jet printing, screen printing, flexographic printing and the other methods described in reference F. C. Krebs "Fabrication and processing of polymer solar cells: A review of printing and coating techniques", Solar Energy Materials and Solar Cells, Volume 93, Issue 4, 2009, Pages 394-412), sputtering.

Different methods can be used to deposit different layers. In a preferred embodiment the following depositing methods can be used for each of the following layers:

- electron contact layer: sputtering or e-beam deposition;
- cathodic buffer layer: spin coating or gravure printing or flexographic printing;
- active layer: spin coating or gravure printing or flexographic printing or screen printing;
- anodic buffer layer; spin coating or gravure or vacuum evaporation or screen printing or flexographic printing;
- hole contact layer: vacuum evaporation or screen printing or ink jet printing or flexographic printing.

Preferably, in the inverted polymer solar cell according to the present invention, the different layers have the following values of thickness:

- electron contact layer: from 50 to 100 nm, more preferably from 80 to 100 nm;
- cathodic buffer layer: from 10 to 100 nm, more preferably from 20 to 50 nm;
- active layer: from 50 to 250 nm, more preferably from 100 to 200 nm;
- anodic buffer layer: from 20 to 200 nm, more preferably from 50 to 100 nm;
- hole contact layer: from 50 to 150 nm, more preferably from 80 to 120 nm.

The present invention is now further illustrated with reference to the figures enclosed herewith, wherein.

FIGS. 6-9 report the characteristic values of the current-voltage curves (I-V) of the devices of Examples 5-8 at different times after the preparation of the sample.

Figure 1:
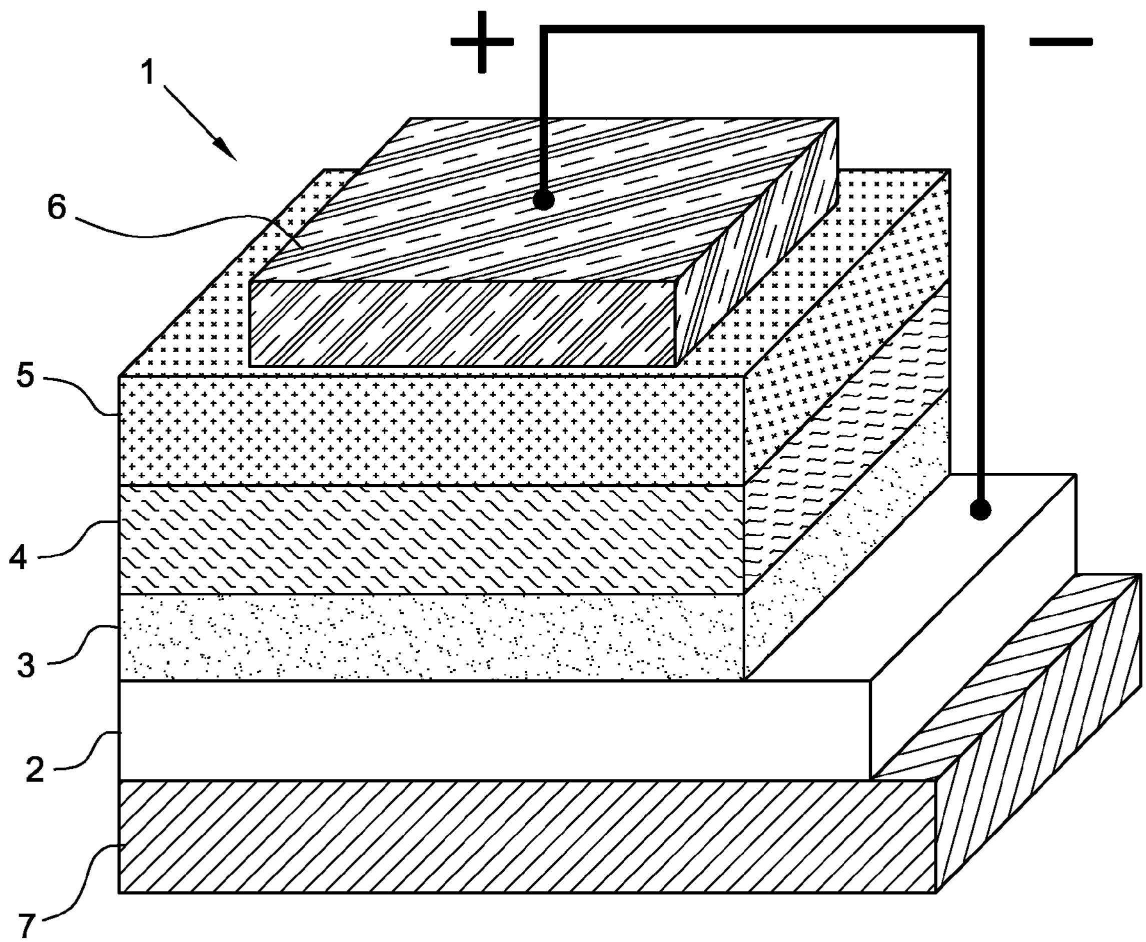
FIG. 1 is a schematic representation of an inverted polymer solar cell according to the present invention.

With reference to FIG. 1, an inverted polymer solar cell (1) comprises an electron contact layer (2) on which a cathodic buffer layer (3) is deposited according to the present invention. An active layer (4), comprising at least one π-conjugated polymer and at least one organic electron acceptor compound, is formed onto said cathodic buffer layer (3), which, as described above, is usually made from a PCBM:P3HT mixture. An anodic buffer layer (5) is laid down onto the active layer (4), which, as described above, may be made from PEDOT doped with PSS. Finally, a hole contact layer (6), usually made from a metal, is placed onto the anodic buffer layer (5). Preferably, the electron contact layer (2) may be associated to a substrate layer (7), as described above.

The following examples are provided to further illustrate the invention.

EXAMPLE 1

(Comparative)—ZSG22 (ZnO 0.15 M in n-butanol/t-butanol 6.5:1)

The following reagents were introduced into a schlenk tube equipped with a Allihn condenser:

310 mg (1.5 mmol) Zinc acetate dihydrate 180 mg (3.0 mmol) 2-Ethanolamine 1 g tert-butanol to which 1-butanol was added in such a quantity to bring the total volume to 10 ml.

The mixture was then warmed under stirring for 3 hours at 90° C., and successively transferred to a glass vial with a screw cap.

EXAMPLE 2

ZSG23 (ZnO 0.15 M in n-butanol/t-butanol 6.5:1; p-butoxy-benzoic acid 6.6% mol/mol)

The following reactives were introduced into a schlenk tube equipped with a Allihn condenser:

310 mg (1.5 mmol) zinc acetate dihydrate
180 mg (3.0 mmol) 2-ethanolamine
1 g tert-butanol to which 1-butanol was added in such a quantity to bring the total volume to 10 ml.

The mixture was then warmed under stirring during 3 hours at 90° C. The following reactive was then added:

8 mg (0.041 mmol) of p-butoxy-benzoic acid

The so obtained mixture was let reacting for 30 min at room temperature. Finally, the solution was transferred to a glass vial with a screw cap.

EXAMPLE 3

ZSG24 (ZnO 0.15 M in n-butanol/t-butanol 6.5:1; benzoic acid 6.6% mol/mol)

The following reactives were introduced into a schlenk tube equipped with a Allihn condenser:

310 mg (1.5 mmol) zinc acetate dihydrate
180 mg (3.0 mmol) 2-ethanolamine
1 g tert-butanol to which 1-butanol was added in such a quantity to bring the total volume to 10 ml.

The mixture was then warmed under stirring during 3 hours at 90° C. The following reactive was then added:

5 mg (0.041 mmol) of benzoic acid.

The so obtained mixture was let reacting for 30 min at room temperature. Finally, the solution was transferred to a glass vial with a screw cap.

EXAMPLE 4

ZSG25 (ZnO 0.15 M in n-butanol/t-butanol 6.5:1; p-cyanobenzoic acid 6.6% mol/mol)

The following reactives were introduced into a schlenk tube equipped with a Allihn condenser:

310 mg (1.5 mmol) zinc acetate dihydrate
180 mg (3.0 mmol) 2-ethanolamine
1 g tert-butanol to which 1-butanol was added in such a quantity to bring the total volume to 10 ml.

The mixture was then warmed under stirring for 3 hours at 90° C. The following reactive was then added:

6 mg (0.041 mmol) p-cyano-benzoic acid

The so obtained mixture was let reacting for 30 min at room temperature. Finally, the solution was transferred to a glass vial with a screw cap.

EXAMPLE 5

Reference Cell

A polymer based device was prepared on a ITO (Indium Tin Oxide) coated glass substrate, previously submitted to a cleaning procedure consisting in a manual cleaning, wiping with a lint-free cloth soaked with a detergent diluted in tap water. The substrates were then rinsed with tap water. Successively, the substrates were thoroughly cleaned according to the following methods in sequence: ultrasonic baths in (i) distilled water plus detergent (followed by manual drying with a lint-free cloth); (ii) distilled water (followed by manual drying with a lint-free cloth); (iii) acetone and (iv) isopropanol in sequence. In particular, the substrates were arranged in a becker containing the solvent, located in a ultrasonic bath, kept at room temperature, for a 10 minutes treatment. After treatments (iii) and (iv), each substrate was dried with a compressed nitrogen flux.

Successively, the glass/ITO was further cleaned in an air plasma cleaner, immediately before proceeding to the next step.

The so treated substrate was ready for the deposition of the first layer. The ZnO layer was obtained via a sol-gel process starting from the precursor solution described in Example 1. The solution was spin-casted on the substrate rotating at 500 rpm (acceleration 500 rpm/sec) for 150 sec. The so-obtained layer had a thickness of 30 nm. Once the layer was deposited, it was partially removed with isopropanol from the surface, leaving the layer only on the desired area. The ZnO formation was achieved by annealing the device at 140° C. for 60 min on a hot plate kept in ambient air, covered with a crystallizing dish.

The active layer, composed by poly-3-hexylthiophene and [6,6]-phenyl-$C_{61}$-butyric acid methyl ester (P3HT:PCBM) was spin-casted from a solution 1:0.8 (w/w) in chlorobenzene with a P3HT concentration of 10 mg/ml.

The thin film was obtained by rotation at 300 rpm (acceleration 100 rpm/sec) for 90 sec. The thickness of the layer resulted to be 250-300 nm (measured on a test cell).

Above the so obtained layer, a third layer was deposited, namely the anodic buffer layer, which was obtained by depositing a mixture of HTL Plexcore® (Sigma Aldrich) (poly(3,4-ethylenedioxy)thiophene (PEDOT) doped with p-stryensulphonic acid (PSS)) with isopropanol, 1:1 (v/v), after wetting the surface to be covered with isopropanol, to improve wettability. The thickness of the layer was adjusted by rotation, using a double step process: firstly 1500 rpm (acceleration 100 rpm/sec) for 30 sec, and then 2500 rpm (acceleration 1000 rpm/sec) for 20 sec.

Afterwards, the substrate was patterned with isopropanol to leave a precise area for the device, and heated on a hot plate for 10 min at 120° C. under inert atmosphere.

On top of the layer stack, a 93 nm thick Ag anode was evaporated, suitably masking the device area so as to obtain an active area of 25 $mm^2$. The deposition was carried out in a standard thermal evaporation chamber containing the substrate and a resistance-heated evaporation vessel containing 10 commercial silver shots (diameter 1-3 mm). The evaporation process was carried out under high vacuum. The evaporated silver condensed on the unmasked regions of the substrate.

The electrical characterization of the device was initially performed under controlled atmosphere (nitrogen) in a glove box at room temperature. Successively it was performed in the same conditions but after exposing the device to the air for increasing periods of time.

Figure 2:
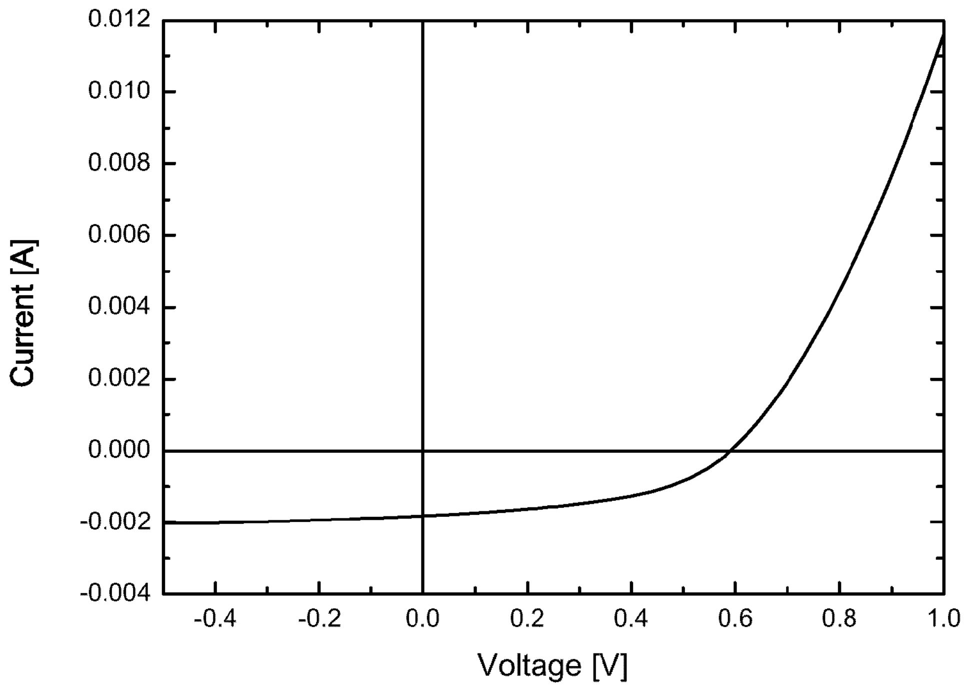
FIGS. 2-5 are the current-voltage curves (I-V) for the devices of Examples 5-8.

The current-voltage curves (I-V) were recorded with a multimeter Keithley® 2600A connected to a personal computer for data collection. Photocurrent was measured by exposing the device to the light of a ABET SUN® 2000-4 sun simulator, able to provide an AM 1.5G irradiation with an intensity of 100 $mW/cm^2$ (1 sun), measured with a Ophir Nova® II powermeter connected to a thermal head 3A-P. The so obtained current-voltage curve (I-V) is reported in FIG. 2. In Table 1 the four characteristic parameters are reported as average values.

Figure 3:
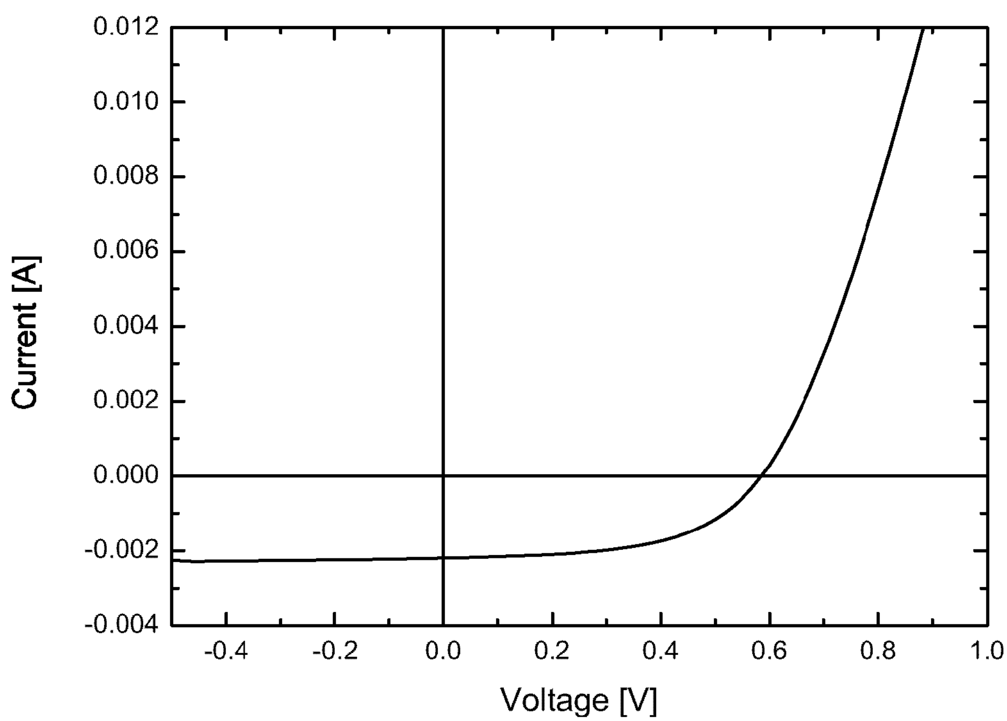
Figure 4:
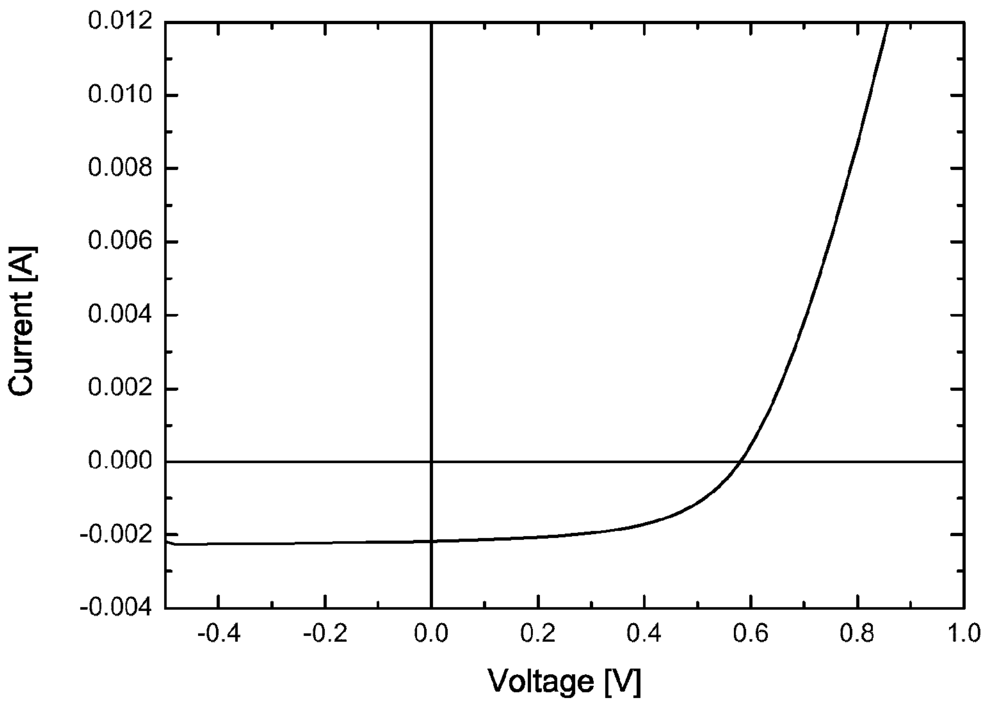
Figure 5:
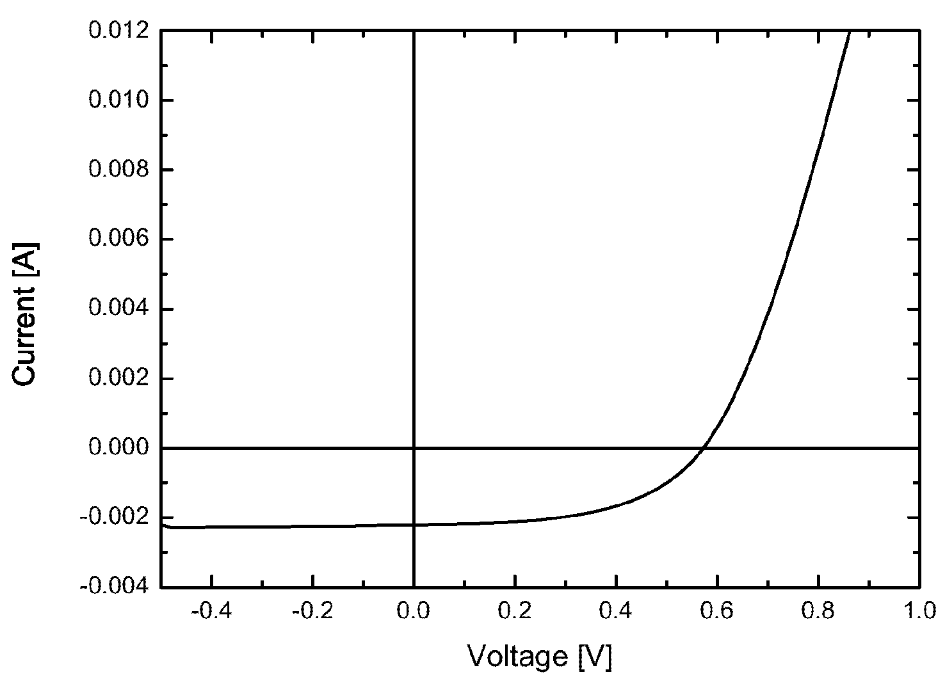

It is important to notice that the current-voltage curve of the inverted polymer solar cell according to the present invention is not S-shaped, as usually occurs with polymer solar cells with zinc oxide as cathodic buffer layer, i.e. it does not show the typical inflection point behavior which is attributed to the high zinc oxide resistivity and the poor charge extraction, properties which limit the efficiency of the device. Many published reports suggest overcoming the above drawback by making some physical post-treatments, such as light soaking, on the devices. Conversely, the inverted polymer solar cells according to the present invention do not show the above behavior, and therefore are more efficient. The same result was obtained with the devices according to Examples 6-8 (see FIGS. 3-5).

Figure 6:
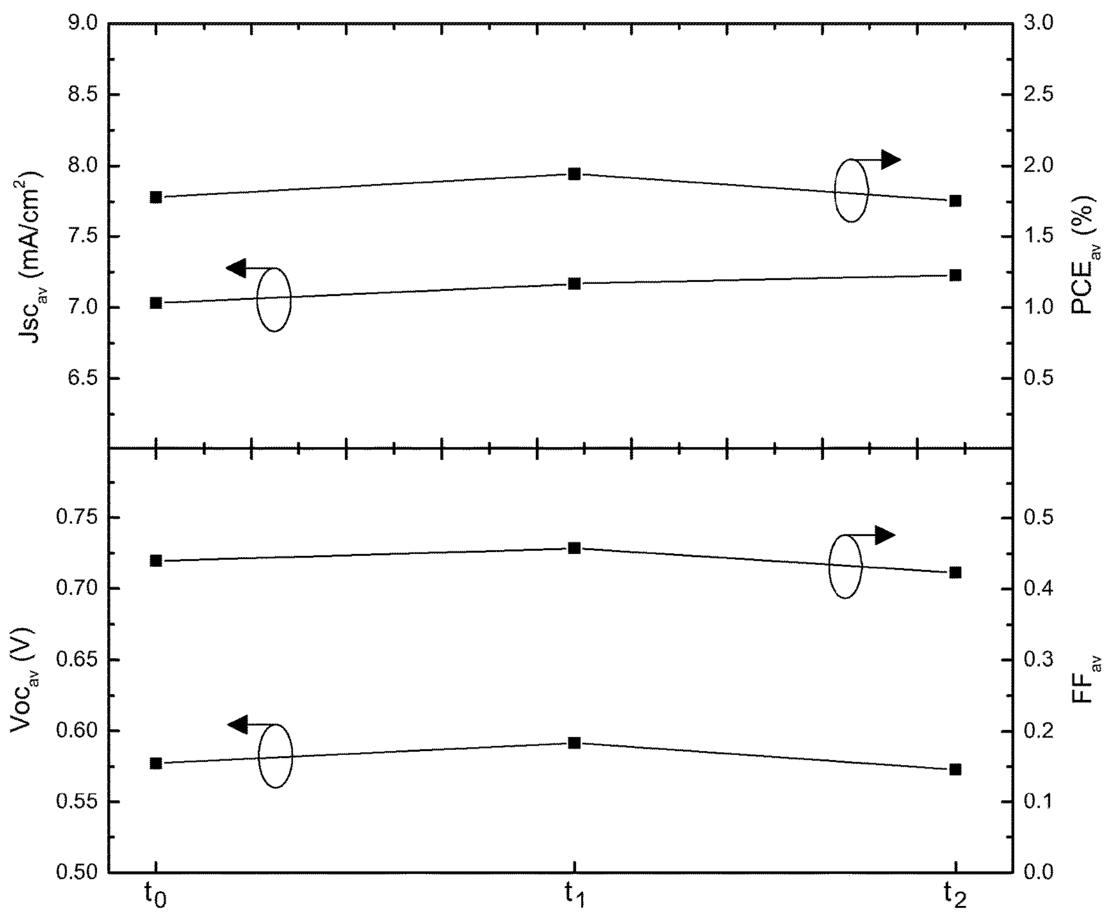
Figure 7:
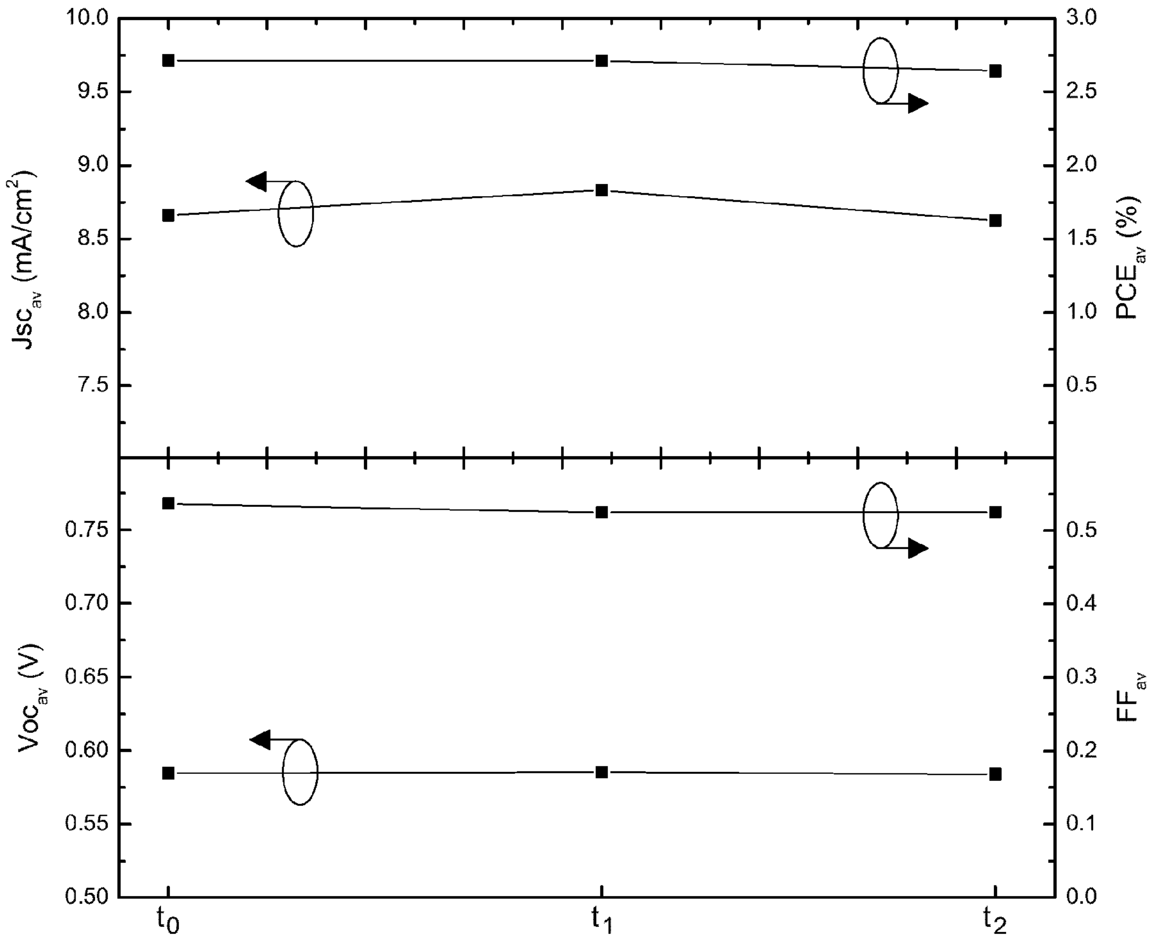
Figure 8:
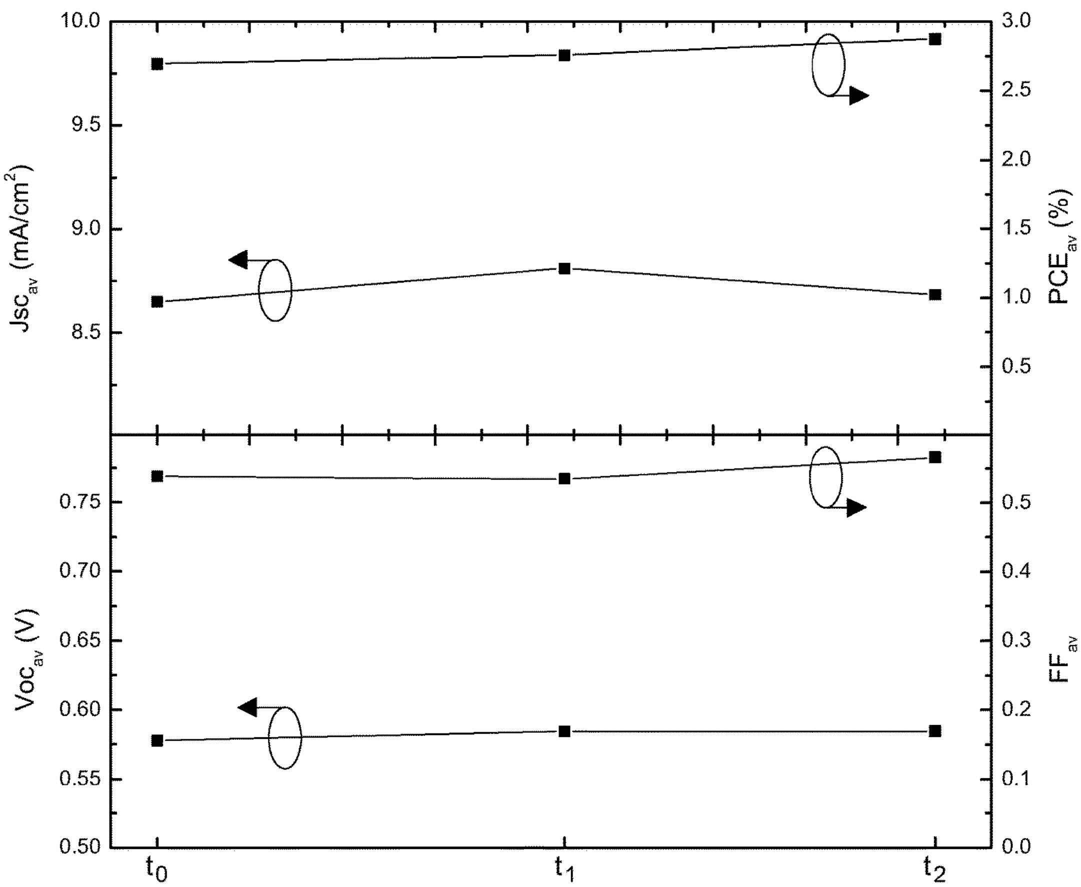
Figure 9:
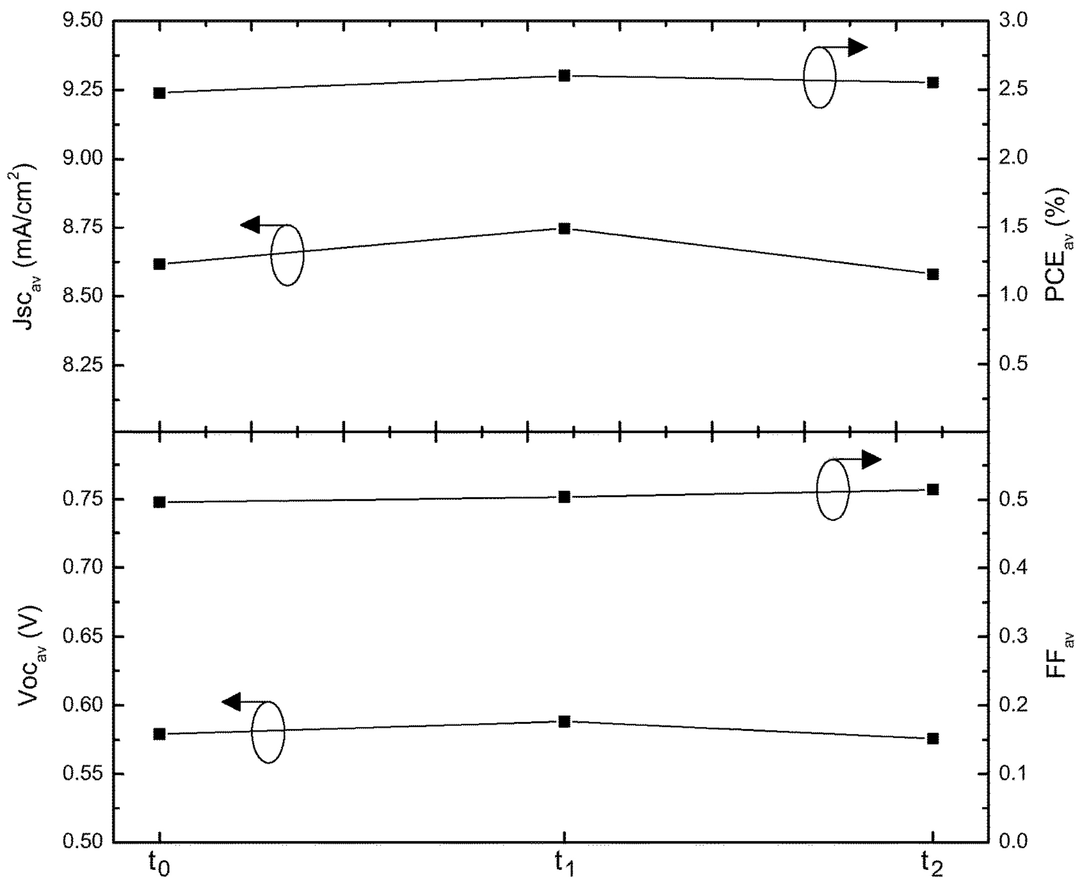

The characteristic values of the current-voltage curves (I-V) are reported in FIG. 6 at different times after the preparation of the sample, namely: the same day the sample was prepared (t0); after 22 days from the preparation and further 24 hours of exposition to air (t1); after 59 days from the preparation and further 7 days of exposition to air (t2).

EXAMPLE 6

Cell Containing P-Butoxy Benzoic Acid

The substrate was cleaned as described for the reference sample (Example 5), and was then treated with air plasma.

The substrate was ready for the deposition of the first layer. The ZnO layer was obtained via a sol-gel process starting from the precursor solution described in Example 2. The solution was spin-casted on the substrate rotating at 600 rpm (acceleration 500 rpm/sec) for 150 sec. The so obtained layer had a thickness of 30 nm. Once the layer was deposited, it was partially removed with isopropanol from the surface, leaving the layer only on desired area. The ZnO formation was achieved by annealing the device at 140° C. for 60 min on a hot plate kept in ambient air, covered with a crystallizing dish. The other layers of the device were produced as described in Example 5.

The electrical characterization of the device was carried out as described in Example 5. The results are reported in Table 1, FIG. 3 and FIG. 7.

EXAMPLE 7

Cell Containing Benzoic Acid

The substrate was cleaned as described for the reference sample (Example 5), and was then treated with air plasma.

The substrate was then ready for the deposition of the first layer. The ZnO layer was obtained via a sol-gel process starting from the precursor solution described in Example 3. The solution was spin-casted on the substrate rotating at 600 rpm (acceleration 500 rpm/sec) for 150 sec. The so obtained layer had a thickness of 30 nm. Once the layer was deposited, it was partially removed with isopropanol from the surface, leaving the layer only on desired area. The ZnO formation was achieved by annealing the device at 140° C. for 60 min on a hot plate kept in ambient air, covered with a crystallizing dish. The other layers of the device were produced as described in Example 5.

The electrical characterization of the device was carried out as described in Example 5. The results are reported in Table 1, FIG. 4 and FIG. 8.

EXAMPLE 8

Cell Containing P-Cyano Benzoic Acid

The substrate was cleaned as described for the reference sample (Example 5), and was then treated with air plasma.

The substrate was then ready for the deposition of the first layer. The ZnO layer was obtained via a sol-gel process starting from the precursor solution described in Example 4. The solution was spin-casted on the substrate rotating at 600 rpm (acceleration 500 rpm/sec) for 150 sec. The so obtained layer had a thickness of 30 nm. Once the layer was deposited, it was partially removed with isopropanol from the surface, leaving the layer only on desired area. The ZnO formation was achieved by annealing the device at 140° C. for 60 min on a hot plate kept in ambient air, covered with a crystallizing dish. The other layers of the device were produced as described in Example 5.

The electrical characterization of the device was carried out as described in Example 5. The results are reported in Table 1, FIG. 5 and FIG. 9.

TABLE 1

| Example | FF | Voc (mV) | Jsc (mA/cm$^2$) | PCE$_{av}$ (%) |
|---|---|---|---|---|
| 5 (*) | 0.47 | 590.38 | 7.12 | 2.00 |
| 6 | 0.54 | 585.49 | 8.74 | 2.78 |
| 7 | 0.55 | 579.89 | 8.69 | 2.75 |
| 8 | 0.53 | 571.67 | 8.88 | 2.70 |

(*) reference where:

FF (Fill Factor) is defined by the ratio $$\frac{V_{MPP} \cdot J_{MPP}}{V_{OC} \cdot J_{SC}},$$

where $V_{MPP}$ and $J_{MPP}$ are, respectively, voltage and current density corresponding to the maximum power point;

Voc is the open circuit voltage;

Jsc is the short circuit current density;

PCE$_{av}$ is the device efficiency, calculated as $$\frac{V_{OC} \cdot J_{SC} \cdot FF}{P_{in}}$$

where $P_{in}$ is the incident light intensity on the device.

The invention claimed is:

1. An inverted polymer solar cell, comprising:

an electron contact layer;

only a single cathodic buffer layer;

an active layer comprising at least one π-conjugated polymer and at least one organic electron acceptor compound;

an anodic buffer layer; and a hole contact layer;

wherein the cathodic buffer layer is prepared by forming a single layer onto the electron contact layer with a composition comprising zinc oxide, titanium dioxide, a precursor thereof, or a combination thereof, at least one organic solvent, at least one chelating agent, and at least one interfacial agent selected from the group consisting of an optionally substituted $C_7$-$C_{21}$ aromatic carboxylic acids or salts thereof; and annealing the single layer formed onto said electron contact layer to form the single cathodic buffer layer which comprises the zinc oxide, the titanium dioxide, or both, and the at least one interfacial agent comprising the optionally substituted $C_7$-$C_{21}$ aromatic carboxylic acid or salts thereof.

2. The inverted polymer solar cell according to claim 1, wherein the at least one interfacial agent is benzoic acid or a substituted benzoic acid.

3. The inverted polymer solar cell according to claim 2, wherein the at least one interfacial agent is a benzoic acid p-substituted with an electron withdrawing or electron donating group.

4. The inverted polymer solar cell according to claim 3, wherein the electron withdrawing or electron donating group is selected from the group consisting of a $C_1$-$C_{12}$ alkyl group.

5. The inverted polymer solar cell according to claim 1, wherein the interfacial agent is present in an amount such that a molar ratio of interfacial agent to the zinc contained in the zinc oxide, the titanium contained in the titanium dioxide or both is from 0.01 to 0.2.

6. The inverted polymer solar cell according to claim 1, wherein the electron contact layer is formed from a material selected from the group consisting of an Indium Tin Oxide (ITO), a Fluorine doped Tin Oxide (FTO), an Aluminium doped Zinc Oxide (AZO), and a Gadolinium Oxide doped Zinc Oxide (GZO).

7. The inverted polymer solar cell according to claim 1, wherein the electron contact layer is associated to a substrate layer.

8. The inverted polymer solar cell according to claim 1, wherein, in the active layer, the 7-conjugated polymer is regioregular poly(3-hexylthiophene) (P3HT).

9. The inverted polymer solar cell according to claim 1, wherein, in the active layer, the organic electron acceptor compound is a fullerene derivative.

10. The inverted polymer solar cell according to claim 1, wherein the anodic buffer layer is selected from the group consisting of a poly(3,4-ethylenedioxy)thiophene (PEDOT) doped with p-styrene sulphonic acid (PSS), $MoO_3$, a polyaniline, $NiO_2$, $WO_3$, and $V_2O_5$.

11. The inverted polymer solar cell according to claim 1, wherein the hole contact layer is made from a metal.

12. A process for producing the inverted polymer solar cell of claim 1, the process comprising:

depositing the cathodic buffer layer onto the electron contact layer;

depositing the active layer onto the cathodic buffer layer comprising the at least one $\pi$-conjugated polymer and the at least one organic electron acceptor compound;

depositing the anodic buffer layer onto the active layer; and placing the hole contact layer onto the anodic buffer layer, wherein the depositing of the cathodic buffer layer comprises:

forming the single layer onto the electron contact layer of a composition comprising at least the zinc oxide and/or the titanium dioxide or a precursor thereof, the at least one organic solvent, the at least one chelating agent, and the at least one interfacial agent; and annealing the single layer formed onto the electron contact layer so as to form the cathodic buffer layer comprising the zinc oxide, the titanium dioxide, or both.

13. The process according to claim 12, wherein the composition comprising the zinc oxide precursor, which is selected from the group consisting of a zinc salt and a zinc complex.

14. The process according to claim 12, wherein the composition comprising the titanium oxide precursor, which is selected from the group consisting of a titanium salt and a titanium complex.

15. The process according to claim 12, wherein a concentration of [zinc oxide and/or titanium dioxide precursors in the composition ranges from 0.05 to 0.5 M.

16. The process according to claim 12, wherein the chelating agent is selected from the group consisting of ethanolamine, diethanolamine, ethylendiamine, and mixtures thereof.

17. The process according to claim 12, wherein the chelating agent is present in the composition in an amount such that a molar ratio ligand/Zn is from 0.5 to 4.

18. The process according to claim 12, wherein the organic solvent is at least one $C_1$-$C_{10}$ alcohol.

19. The process according to claim 18, wherein the organic solvent is a mixture of two $C_2$-$C_6$ alcohols, one of the two alcohols having a boiling point lower than 100° C. and a viscosity higher than 3 mPa·s, a second alcohol having a boiling point equal to or higher than 100° C. and a viscosity equal to or lower than 3 mPa·s.

20. The process according to claim 19, wherein a weight ratio of the solvent mixture, [low boiling point-high viscosity alcohol]/[high boiling point-low viscosity alcohol] ranges from 0.01 to 5.

21. The process according to claim 12, wherein the annealing of the single layer formed onto the electron contact layer occurs by heating the single layer at a temperature of from 50 to 200° C. for a time ranging from 30 seconds to 2 hours.

* * * * *